United States Patent
Takano et al.

(10) Patent No.: US 7,447,109 B2
(45) Date of Patent: Nov. 4, 2008

(54) SEMICONDUCTOR STORAGE DEVICE

(75) Inventors: Susumu Takano, Kanagawa (JP);
Hiroyuki Takahashi, Kanagawa (JP)

(73) Assignee: NEC Electronics Corporation,
Kawasaki, Kanagawa (JP)

( * ) Notice: Subject to any disclaimer, the term of this patent is extended or adjusted under 35 U.S.C. 154(b) by 110 days.

(21) Appl. No.: 11/136,484

(22) Filed: May 25, 2005

(65) Prior Publication Data

US 2005/0265086 A1  Dec. 1, 2005

(30) Foreign Application Priority Data

May 26, 2004  (JP)  ............................. 2004-156470
Oct. 27, 2004  (JP)  ............................. 2004-312281

(51) Int. Cl.
*G11C 8/00* (2006.01)
*G11C 7/10* (2006.01)

(52) U.S. Cl. ............................. 365/233.13; 365/189.03; 365/189.05; 365/191; 365/233.11; 365/233.18

(58) Field of Classification Search ............ 365/189.03, 365/191, 233, 230.08, 189.05, 220, 233.1, 365/233.11, 233.13, 233.18, 191.233; 711/169
See application file for complete search history.

(56) References Cited

U.S. PATENT DOCUMENTS

| | | | | |
|---|---|---|---|---|
| 5,280,597 | A * | 1/1994 | Takata et al. ................. | 711/169 |
| 5,394,529 | A * | 2/1995 | Brown et al. ................. | 712/240 |
| 5,584,044 | A * | 12/1996 | Gouhara et al. ............... | 710/74 |
| 5,960,458 | A * | 9/1999 | Kametani ..................... | 711/147 |
| 6,272,053 | B1 * | 8/2001 | Choi ...................... | 365/189.03 |
| 6,285,611 | B1 * | 9/2001 | Kang .......................... | 365/205 |
| 6,427,197 | B1 * | 7/2002 | Sato et al. .................... | 711/169 |
| 6,691,204 | B1 * | 2/2004 | Roohparvar ................. | 711/103 |
| 6,751,717 | B2 * | 6/2004 | Johnson ...................... | 711/167 |
| 6,839,821 | B2 * | 1/2005 | Estakhri ...................... | 711/169 |
| 6,871,254 | B2 * | 3/2005 | Kurohmaru ................. | 711/100 |
| 7,047,375 | B2 * | 5/2006 | Davis et al. ................. | 711/158 |
| 7,051,178 | B2 * | 5/2006 | Roohparvar ................. | 711/169 |
| 7,142,021 | B2 * | 11/2006 | Park .......................... | 326/104 |
| 7,225,312 | B2 * | 5/2007 | Pawlowski ................... | 711/167 |
| 2001/0000819 | A1 * | 5/2001 | Manning .................... | 711/168 |
| 2001/0053106 | A1 * | 12/2001 | Sadakata ................ | 365/230.05 |
| 2002/0018395 | A1 * | 2/2002 | McLaury .................... | 365/233 |
| 2003/0151966 | A1 * | 8/2003 | Demone ..................... | 365/222 |
| 2004/0246783 | A1 * | 12/2004 | Lee et al. ............... | 365/189.05 |
| 2005/0127945 | A1 * | 6/2005 | Park ............................ | 326/52 |
| 2006/0041713 | A1 * | 2/2006 | Charles et al. .............. | 711/105 |

FOREIGN PATENT DOCUMENTS

| | | | |
|---|---|---|---|
| GB | 2232797 A | * | 12/1990 |
| JP | 07296593 A | * | 11/1995 |
| JP | 11-328971 | | 11/1999 |

* cited by examiner

*Primary Examiner*—Ly D Pham
(74) *Attorney, Agent, or Firm*—McGinn IP Law Group, PLLC

(57) ABSTRACT

Disclosed is a semiconductor storage device which has a shared address/data terminal that shares an address terminal and a data terminal. In a latency period extending from receipt of an access command to a cell array to input or output of data, which corresponds to an access command, from the shared address/data terminal, pipeline control is performed in response to receipt of at least one other access command. Input or output of data from the shared address/data terminal corresponding to the other access commands is performed successively following data that corresponds to the initial access command.

17 Claims, 14 Drawing Sheets

SEMICONDUCTOR STORAGE DEVICE

FIELD OF THE INVENTION

This invention relates to a semiconductor storage device and, more particularly, to a semiconductor storage device that lends itself to a reduction in number of pins and an increase in speed.

BACKGROUND OF THE INVENTION

A semiconductor storage device in which a cell array is constituted by dynamic memory cells requiring refresh for data retention and which functions as a static random-access memory (SRAM) (such a storage device is also referred to as "pseudo SRAM") has come into use in recent times. A Mobile Specified RAM Family (also referred to as an "MSRAM") also has been developed. An MSRAM is functionally compatible with a low-power-consumption SRAM and achieves a large increase in capacity (e.g., 16 to 128 M), which is not possible with an SRAM, by employing a DRAM (Dynamic Random-Access Memory) memory cell.

FIG. 8 is a diagram illustrating an example of dynamic operation of a burst mode (burst length=8) in a clock-synchronized semiconductor storage device (synchronous DRAM, or "SDRAM"). The SDRAM is characterized by the following:

it has an SDR (single data rate) of a clock frequency of 133 MHz;

the burst length (word length of successively output data) is 8 bits, 16 bits (one word) parallel;

the CAS latency (number of clocks from input of a read command to output of the initial valid data) is 3; and the time needed to transfer an 8-word burst is 120 ns.

In FIG. 8, CLK represents a synchronizing clock signal, CMD/Add denotes a command/address signal, and Dout/Din represents a data signal at a data input/output terminal. A bank active command (ACT) and a row address are input and the bank is activated. Upon elapse of a predetermined cycle period (tRCD, e.g., 30 ns=four clock cycles), a read command (RD) and a column address are input. Word data QA0 to QA7 having a burst length set by a mode register and an address designated in accordance with /CAS latency (CL=3) is output. PRE represents a precharge command. In the example shown in FIG. 8, one clock cycle is equal to 7.5 ns, and the period of time from the ACT command to the next ACT command is 120 ns.

In an SDRAM the timing operation of which is exemplified in FIG. 8, the cycle that occupies the memory core is long owing to the continuation of row access. Further, one access cycle requires three commands, namely the active command (ACT), the read/write command (RD) and the precharge command (PRE). Furthermore, refresh control from an external SDRAM controller is required. The number of pins is reduced by address multiplexing of the row and column addresses (RAS, CAS).

FIG. 9A illustrates an example of operation of an MSRAM of SRAM interface specifications in which the cell array is constituted by a DRAM. An SDRAM the timing operation of which is exemplified in FIG. 9A is characterized by the following:

it has an SDR (single data rate) of a clock frequency of 133 MHz;

the burst length is 8 bits, 16 bits (one word) parallel;

the rate latency (RL) is 7; and the time needed to transfer an 8-word burst is 112.5 ns.

In this MSRAM, a WAIT signal is output as the active state when conflict occurs with internal refresh at the instant a chip-select signal /CS (low active) undergoes a transition from the high to the low level. It should be noted that precharging is performed automatically in the MSRAM.

As illustrated in FIG. 9A, the time required for transfer of an 8-word burst is 112.5 ns, which is one to two cycles faster in comparison with the SDRAM of FIG. 8. Further, in a semiconductor storage device having the timing operation illustrated in FIG. 9A, a decline in performance ascribable to refresh basically is nil.

FIG. 9B illustrates an example of operation in a case where addresses and data are multiplexed in an MSRAM. FIG. 9B illustrates an example of timing operation in a burst mode (burst length=8) of a clock-synchronized semiconductor storage device in which part of an address terminal is shared with a data terminal to achieve multiplexing. The clock signal CLK is the same as that used in FIG. 9A. In FIG. 9B, ADV represents a signal indicating the validity of an address signal supplied from an address bus to a shared access/data terminal ADD/Data of the MSRAM. In response to activation of ADV, the MSRAM latches the address signal at the shared access/data terminal ADD/Data by a register. From this point onward, the shared access/data terminal ADD/Data functions as a data input/output terminal. In a case where an address and data are used by being multiplexed at a common terminal, the number of pins is reduced in comparison with an SDRAM when the number of data terminals is greater than 32. In the example shown in FIG. 9B, the shared access/data terminal ADD/Data, acting as a data output terminal, outputs readout data QA0 to QA7 in the burst mode.

FIG. 10 is a diagram illustrating the operation of an MSRAM having SRAM interface specifications and equipped with a pipeline burst function. In FIG. 10, CLK represents a synchronizing clock, CMD/Add denotes a command/address signal, and Dout/Din represents a data signal at a data input/output terminal. In this implementation, read commands RDA, RDB, and RDC are input, 8-word successive data QA0 to QA7 corresponding to the read command RDA is output upon a delay equivalent to the CAS latency, 8-word successive data QB0 to QB7 corresponding to the read command RDB is output from the next clock cycle of the output of data QA7, and 8-word successive data QC0 to QC7 corresponding to the read command RDC is output from the next clock cycle of the output of data QB7. After the read command RDA is input, readout data (8 words×3) of the read commands RDA, RDB and RDC are output successively upon elapse of prescribed clock cycles (e.g., 60 ns). Thus, after a read command is input, burst data is output upon elapse of a fixed period of time. In the meantime, while data corresponding to the previous read command is being output, the next command is received. Successive data output is made possible by a random-access address.

It should be noted that the specification of following Patent Document 1 (FIG. 1) discloses a semiconductor memory, which has at least one multiplexing signal input terminal serving as a terminal for inputting both a data signal and an address signal. A control signal (address-enable signal) for identifying whether a signal applied to the multiplexing signal input terminal is a data signal or an address signal.

[Patent Document 1]

JP Patent Kokai Publication JP-A-11-328971

In the semiconductor storage device having the pipeline burst function depicted in FIG. 10, the arrangement is such that while data corresponding to a read command is being output, the next command is received. Read-out data in 8-word units can be output successively without interruption.

However, after the initial read command RDA is input, data is not output to the data terminal for the duration of the latency period and an idle state results. The Inventor has discovered that an even higher speed can be achieved by utilizing this idle state effectively and has accomplished the present invention based upon this discovery.

SUMMARY OF THE INVENTION

A semiconductor storage device according to a first aspect of the present invention, comprises: a shared address/data terminal that shares an address terminal to which an address signal is input and a data terminal for inputting and/or outputting a data signal; a cell array, which has a plurality of memory cells, in which a data signal from a memory cell selected by an address signal is read out, or in which a data signal is written to a memory cell selected and read out; and a circuit for receiving one command to the cell array as an input, accepting at least one other command to the cell array in a period of time from input of the one command to output or input of a data signal, which corresponds to the one command, from the shared address/data terminal, and subjecting the accepted plurality of commands to pipeline processing.

In the present invention, access to the cell array corresponding to the one command and output of data, which has been read out of the cell array in response to the previous command, to the data terminal are performed in overlapped fashion in terms of time.

According to a second aspect of the present invention, the foregoing object is attained by providing a semiconductor storage device comprising: a shared address/data terminal that shares an address terminal and a data terminal for output and/or input; a cell array, which has a plurality of memory cells, in which a data signal from a memory cell that has been selected by an address signal from the address terminal is read out, or a data signal is written to a memory cell that has been selected for read-out; and a circuit for supplying write data from the shared address/data terminal to the cell array and supplying read-out data from the cell array to the shared address/data terminal; wherein in a period of time from receipt of an access command to access the cell array to input or output of data, which corresponds to this access command, from the shared address/data terminal, at least one other access command is received and data corresponding to this other access command is input or output from the shared address/data terminal following data corresponding to the initial access command.

The semiconductor storage device according to the present invention is so adapted that a cell-array read or write access command is input, at least one further access command is accepted by the time data corresponding to the first-mentioned access command is output or input, and the plurality of access commands are subjected to pipeline processing.

According to another aspect of the present invention, the foregoing object is attained by providing a semiconductor storage device having a circuit for exercising control in such a manner that in a cycle that follows a cycle in which a read request and a read address are accepted, read-out data corresponding to the read request is output from a data terminal. In the present invention, it may be so arranged that in a cycle that follows a cycle in which a write request and a write address are accepted, write data corresponding to the write request is accepted.

A semiconductor storage device according to the present invention has a read/write-address pipeline function and includes a circuit for exercising control in such a manner that a write request and a write address are accepted so as to overlap a cycle in which a read-out data signal corresponding to an earlier accepted read request is output from a data terminal, and write data corresponding to the write request is accepted from the data terminal after the read-out data is output from the data terminal.

A semiconductor storage device according to the present invention has a circuit for exercising control in such a manner that a write data signal corresponding to a write request is accepted in a cycle that follows a cycle in which the write request and a write address are accepted, a read request and a read address are accepted so as to overlap a cycle in which the write data signal is input from the data terminal, and read-out data corresponding to a read request is output from the data terminal after the write data is input from the data terminal.

The meritorious effects of the present invention are summarized as follows.

In accordance with the present invention, at least one access command is input in a latency period extending from input of an access command to input/output of data, which corresponds to this command, from a data terminal, a plurality of access commands that have been input are subjected to pipeline control and access is speeded up.

Further, in accordance with the present invention, access to a cell array corresponding to one command and output of data, which has been read out of the cell array in response to the previous command, to a data terminal are performed in overlapped fashion in terms of time and access at higher speed is achieved.

Furthermore, in accordance with the present invention, a semiconductor storage device having an input/output terminal that shares input and output of data is such that it is possible to perform a read/write mutual pipeline operation and to support high-speed data transfer, etc.

Further, in accordance with the present invention, apparent latency is shortened greatly by adopting an arrangement in which read-out data is output in a cycle that follows a cycle in which a read request has been received.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

Figure 11:
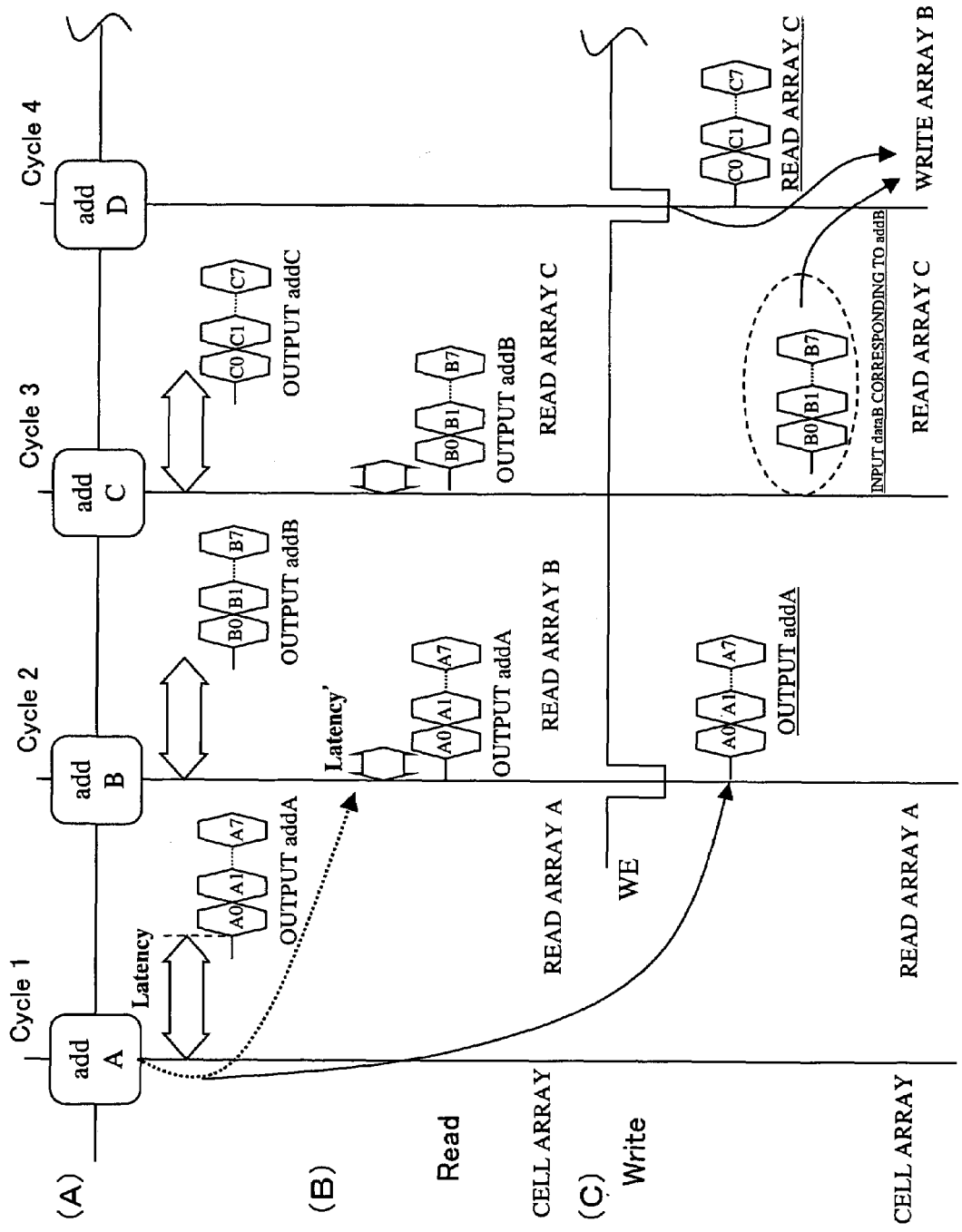
Figure 12:
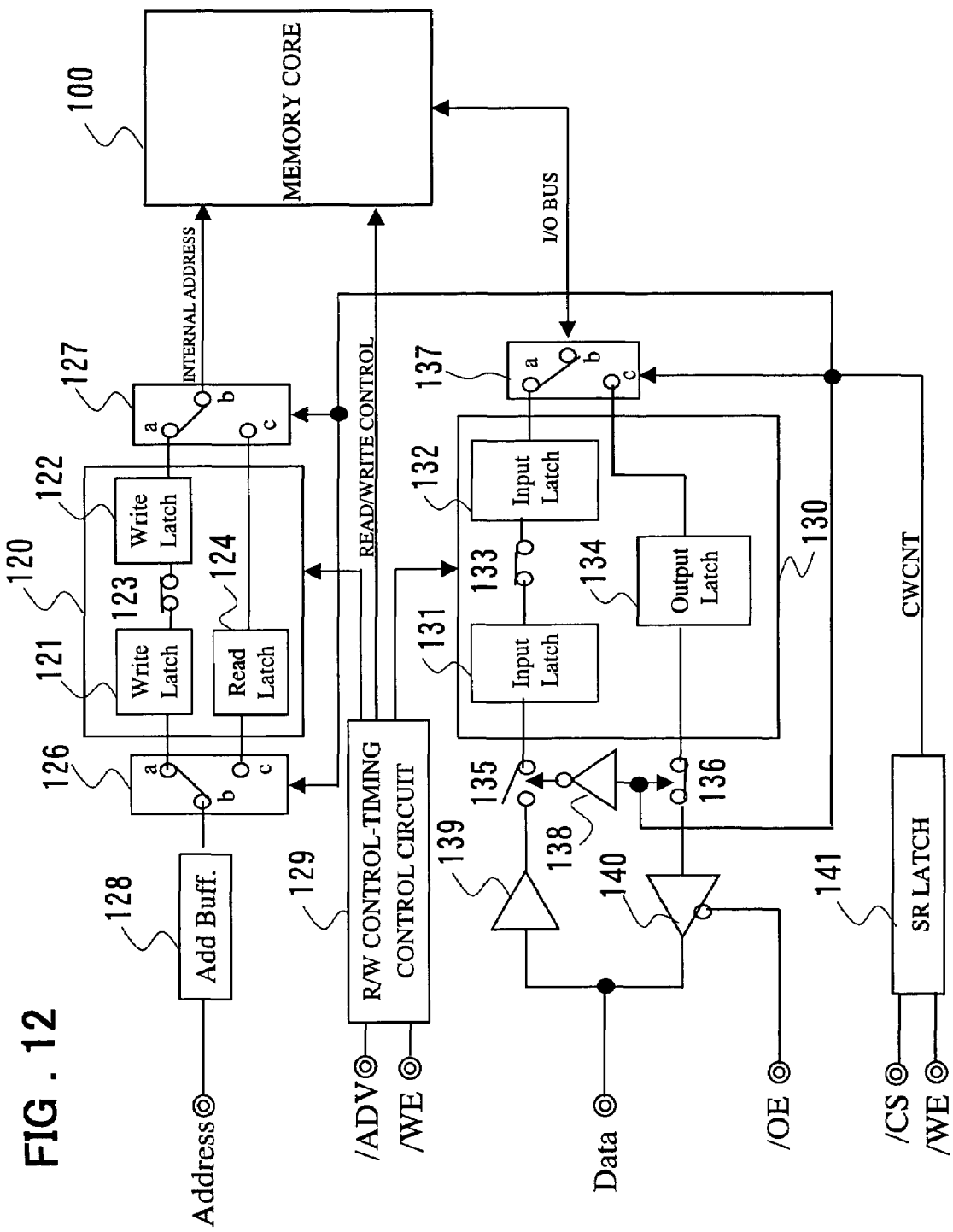
Figure 13:
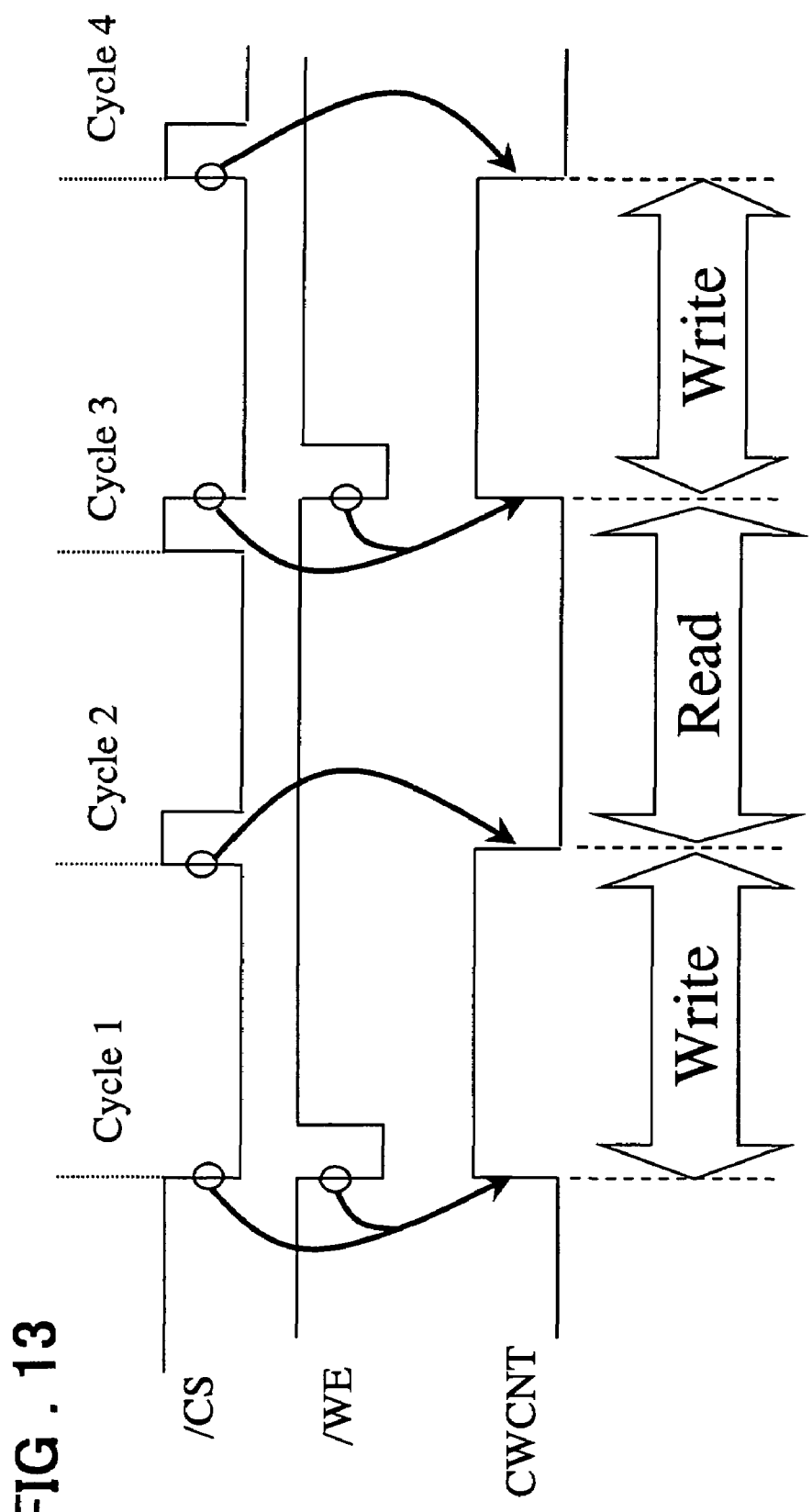
Figure 14:
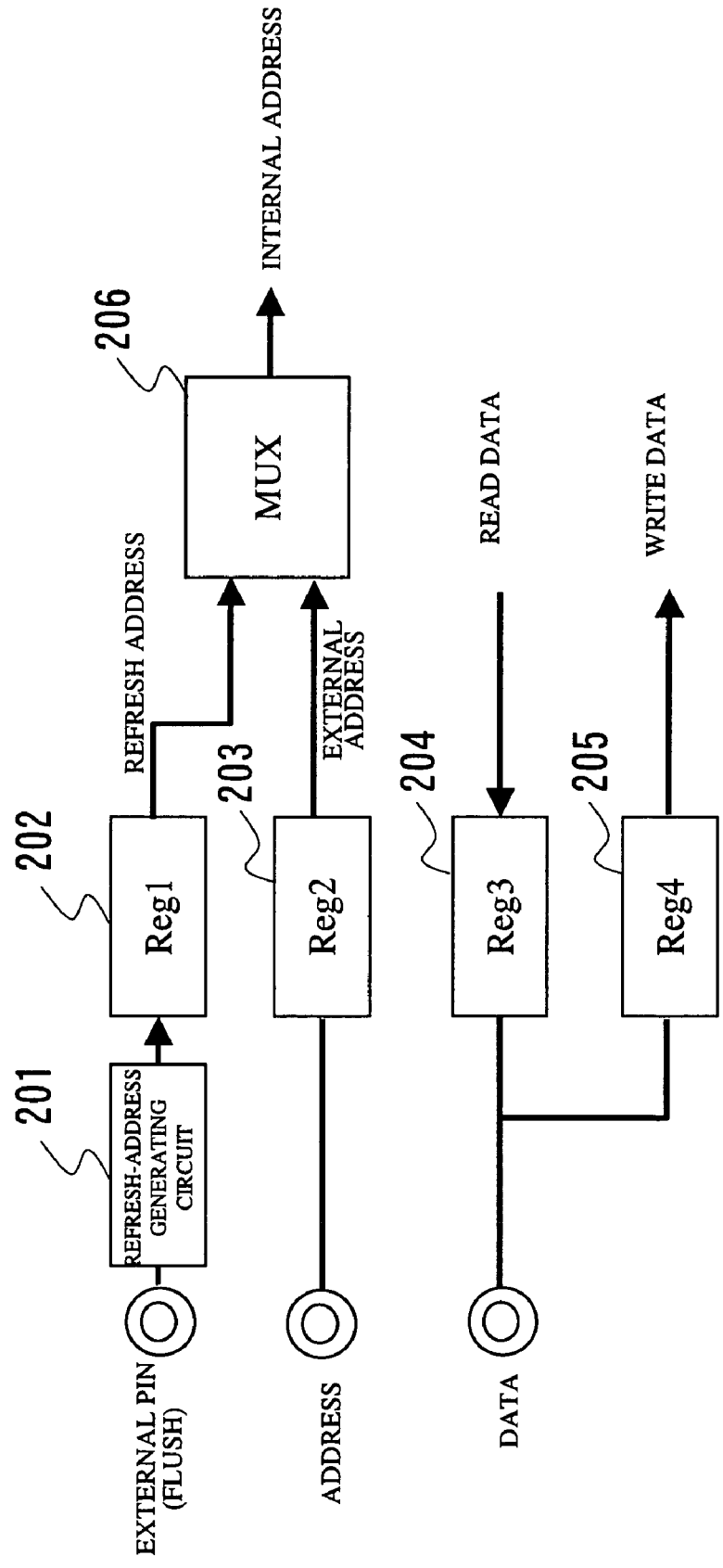

(A) of FIG. 11 is a diagram for describing an example for comparison purposes, and (B) and (C) of FIG. 11 are diagrams for describing read and write operations, respectively of an embodiment of the present invention;

FIG. 12 is a diagram illustrating the structure of another embodiment of the present invention;

FIG. 13 is a timing diagram for describing the operation of yet another embodiment of the invention; and FIG. 14 is a diagram illustrating the structure of a register according to yet another embodiment of the present invention.

PREFERRED EMBODIMENTS OF THE INVENTION

The present invention will now be described in detail with reference to the accompanying drawings.

In a preferred embodiment, a semiconductor storage device according to the present invention includes a shared address/data ADD/Data that shares an address terminal and a data terminal, and a memory core (100), which has a plurality of memory cells, from which data of a memory cell that has been selected by an address signal from the address terminal is read out and to which data is written to a memory cell that has been selected. In a latency period extending from input of one access command to input/output of data, which corresponds to this command, from the shared address/data terminal ADD/Data, at least one access command is input and a plurality of the input access commands undergo pipeline control successively. In the present invention, access to the cell array corresponding to the one command and output to a data terminal of data that has been read out of the cell array in response to the previous command are performed in overlapped fashion in terms of time.

An embodiment of the invention will now be described in detail.

Figure 1:
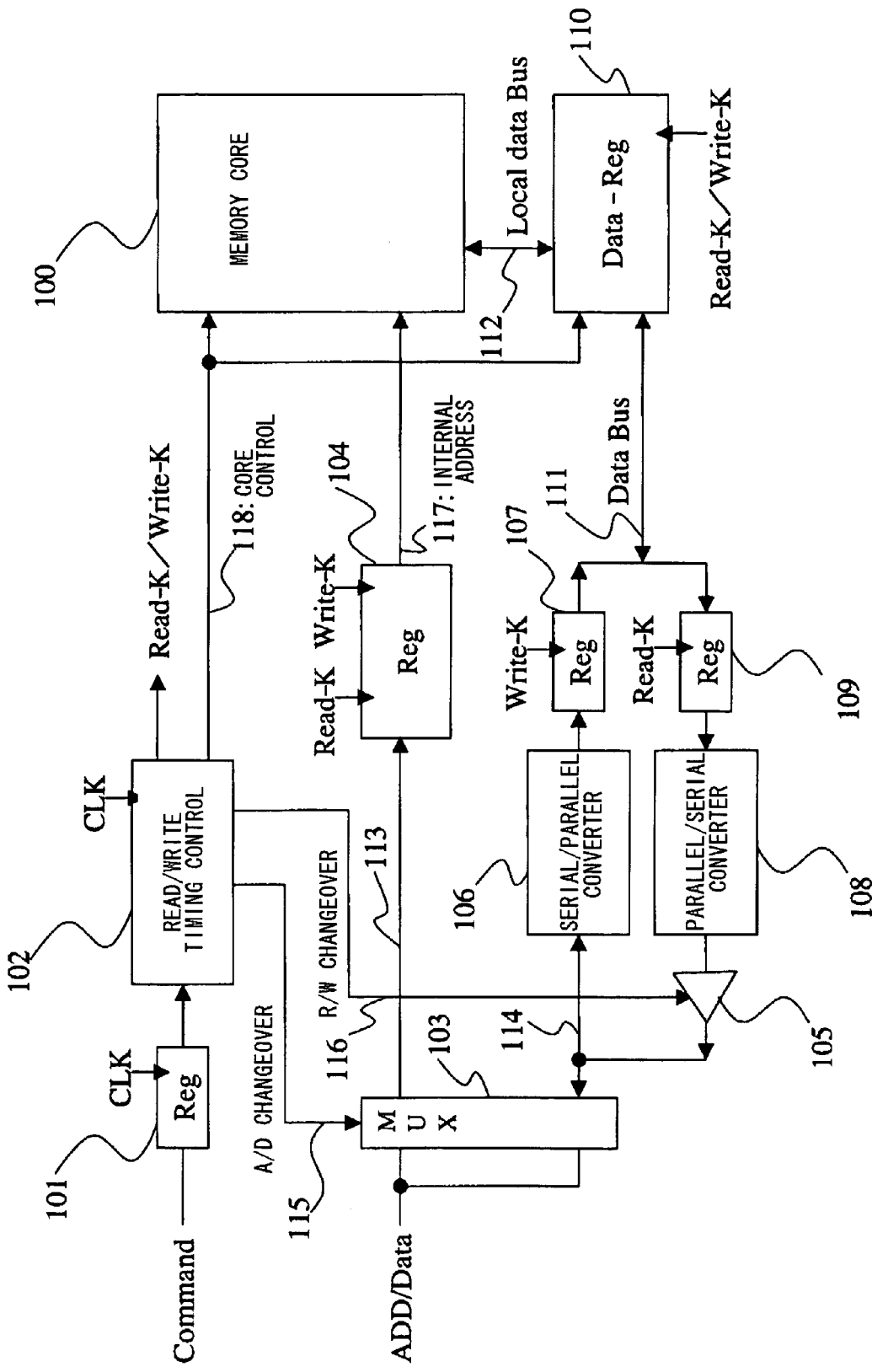
FIG. 1 is a diagram illustrating the structure of a semiconductor storage device according to an embodiment of the present invention.

FIG. 1 is a diagram useful in describing the structure of a semiconductor storage device according to an embodiment of the present invention. As shown in FIG. 1, the semiconductor storage device includes a memory core 100; a register (command register) 101 for receiving and holding a command; a read/write timing control circuit 102; a read/write timing control circuit 102; a multiplexer circuit 103 which switchingly connects a shared address/data terminal ADD/Data to an address line 113 or data line 114 based upon an A/D changeover signal 115 from the read/write timing control circuit 102; a register 104 for receiving an address signal from the multiplexer circuit 103 and outputting an internal address 117; a serial/parallel converting circuit 106 for serially receiving a plurality of items of write data from the multiplexer 103 and converting the data to parallel data; a register 107 for receiving the output of the serial/parallel converting circuit 106; a data register 110 connected via the register 107 and a data bus 111; a register 109 connected via the data register 110 and data bus 111; a parallel/serial converting circuit 108 for receiving a plurality of items of data output from the register 109 in parallel, converting the parallel data to serial data and outputting the serial data; and a tri-state buffer 105 that receives an R/W changeover signal 116 from the read/write timing control circuit 102 and undergoes enable/disable control. It should be noted that the shared address/data terminal ADD/Data may be implemented by sharing part of the address signal (e.g., the lower order bits of the address signal) and the data signal.

The memory core 100 has memory cells at the intersections of bit lines and word lines, although none of these are illustrated. Data that has been read out to a bit line from a memory cell selected by decoders for decoding respective ones of column and row addresses is amplified by an amplifier and the data is output to a local data bus 112 via a selected Y switch. Further, write data from the local data bus 112 is amplified by an amplifier and the data is written to the selected memory cell.

The register 101 stores a command that is input thereto and outputs the command to the read/write timing control circuit 102. In order to hold a plurality of commands that have been entered successively in pipeline fashion, the register 101 is constituted by a FIFO (first in, first out) register having a storage capacity for the maximum number of commands that can input successively. The register 101 samples, holds and outputs a command at an edge, such as a rising edge, of a clock signal CLK.

The read/write timing control circuit 102 receives a command from the register 101 and generates and outputs a read timing signal Read-K and a write timing signal Write-K in dependence upon read/write access. Further, in accordance with a command ADV, the read/write timing control circuit 102 outputs the A/D changeover signal 115 to the multiplexer 103. The A/D changeover signal 115 is for controlling changeover between an address and data with regard to the shared address/data terminal ADD/Data. The read/write timing control circuit 102 receives the command from the register 101 and outputs the R/W changeover signal 116 to the tri-state buffer 105 in accordance with read/write access. The tri-state buffer 105 is placed in an output-enable state when the R/W changeover signal 116 indicates read and in an output-disable state (a state in which the output is in a high impedance state) when the R/W changeover signal 116 indicates write. Furthermore, a core control signal 118 (e.g., a strobe signal that controls row drive such as the driving of word lines, or a signal that controls the activation of columns in a sense amplifier and Y switch) from the read/write timing control circuit 102 is output to the memory core 100. It should be noted that the semiconductor storage device shown in FIG. 1 is not limited to a dynamic-type semiconductor storage device (it may just as well be an SRAM). In the case of a dynamic semiconductor storage device, the read/write timing control circuit 102 may be adapted so as to generate a timing signal that control refresh, etc.

The register 104, which receives the address signal, receives the read timing signal Read-K and the write timing signal Write-K and supplies an internal address to the memory core 100. The memory core 100 receives the core control signal 118 from the read/write timing control circuit 102 and decodes an internal address signal 117 by a decoder (not shown). A selected word line is activated and a memory access operation is performed via the selected Y switch.

It should be noted that the register 104 outputs the internal address signal 117 upon receiving the write timing signal Write-K, which is activated after a delay of prescribed cycles following input of an address signal to the shared address/data terminal ADD/Data. For this reason the register 104 is also referred to as a "late-write register".

Operation of the semiconductor storage device according to the embodiment shown in FIG. 1 will be described next. The data-write operation will be described first. A write address is supplied from the shared address/data terminal ADD/Data and a Write command is sampled by the register 101. The multiplexer 103 connects the shared address/data terminal ADD/Data to the address line 113 so that the address signal that has entered from the shared address/data terminal ADD/Data is supplied to the input terminal of register 104. The latter samples the address signal in response to the write timing signal Write-K and supplies it to the memory core 100 as the internal address signal 117. Next, based upon the A/D changeover signal 115, the multiplexer 103 connects the shared address/data terminal ADD/Data to the data line 114 so that a data signal is input from the shared address/data terminal ADD/Data to the data line 114 serially sequentially in a number of words of the burst length. The serial data is input to the serial/parallel converting circuit 106. The latter converts the serial data to parallel data and supplies the parallel data to the data register 110 via the register 107. The data register 110 accepts the parallel data from the data bus 111 and supplies it to the memory core 100 so that a plurality of items of data are written to selected memory cells. After the initial Write command is input, the next command may be input before data corresponding to the Write command enters. In this case, the next command is held in the register 101.

The data-read operation of the semiconductor storage device according to this embodiment will be described next. A Read command is sampled by the register 101, and a read address is supplied from the shared address/data terminal ADD/Data. The multiplexer 103 connects the shared address/data terminal ADD/Data to the address line 113 so that the address signal is sampled by register 104 based upon the read timing signal Read-K and supplied to the memory core 100. In a case where a further command is input (e.g., a case where a further command is input in a latency period that follows the input of the initial Read command), the command and the address signal are held in the registers 101 and 104, respectively. Next, based upon the A/D changeover signal 115, the multiplexer 103 connects the shared address/data terminal ADD/Data to the data line 114. A plurality of items of data are read out of the memory core 100 and transferred to the data register 110. The read-out data, which is transferred from the data register 110 in parallel via the data bus 111, is supplied to the register 109. The parallel/serial converting circuit 108, which receives a parallel output from the register 109, converts the parallel data to serial data and outputs the serial data. The tri-state buffer 105, which is in the output-enable state, outputs the read-out data signal sequentially in a number of words of the burst length. The signal is output from the shared address/data terminal ADD/Data via the multiplexer 103.

This embodiment is such that in a case where a succeeding Read command has been input in a latency period that extends from input of the previous Read command to output of initial read-out data corresponding to this Read command, the succeeding command is stored in the register 101 in FIFO (first in, first out) fashion. In a case where an address corresponding to the succeeding Read command has been input to the shared address/data terminal ADD/Data and an address-valid signal has been activated, the address signal that has been input to the shared address/data terminal ADD/Data is sampled.

Figure 2:
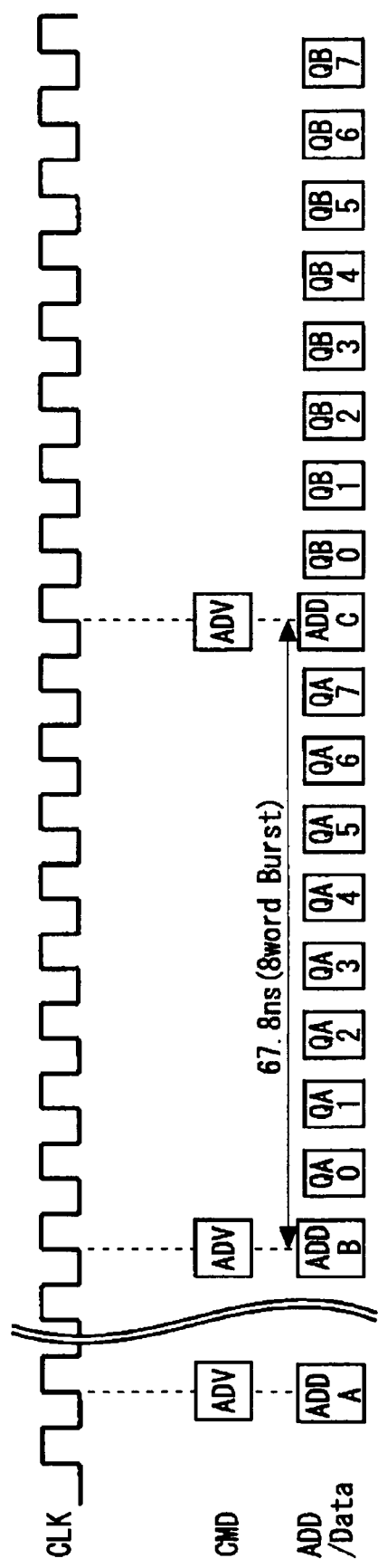
FIG. 2 is a timing diagram for describing the operation of the present embodiment.

FIG. 2 is a timing diagram for describing the operation of the present embodiment. In the example shown in FIG. 2, an address-valid signal ADV, which is activated when an address signal supplied from the CPU side to a memory is valid, is used as the address-data changeover signal. In the arrangement in which an address terminal and data terminal are shared and used to perform multiplexing, one address signal (A) is input to the shared address/data terminal ADD/Data and the address-valid signal ADV is activated. In the period from latching of the address signal (A) in the register 104 to output of read-out data, which corresponds to the address signal (A), from the shared address/data terminal ADD/Data, a succeeding address signal (B) is input to the shared address/data terminal ADD/Data, the address-valid signal ADV is activated and the address signal (B) is latched in the register 104. Read-out data QA0 to QA7 of eight words corresponding to the address signal (A) is output in the following clock cycle from the shared address/data terminal ADD/Data in a burst (burst length=8) in parallel-data units of one word.

In the next clock cycle, an address signal (C) is input from the shared address/data terminal ADD/Data, the address-valid signal ADV is activated, and address signal (C) is latched in the register. Read-out data QB0 to QB7 corresponding to the address signal (B) are output in the following clock cycles from the shared address/data terminal ADD/Data in a burst (burst length=8) in a parallel-data unit of one word.

Figure 3:
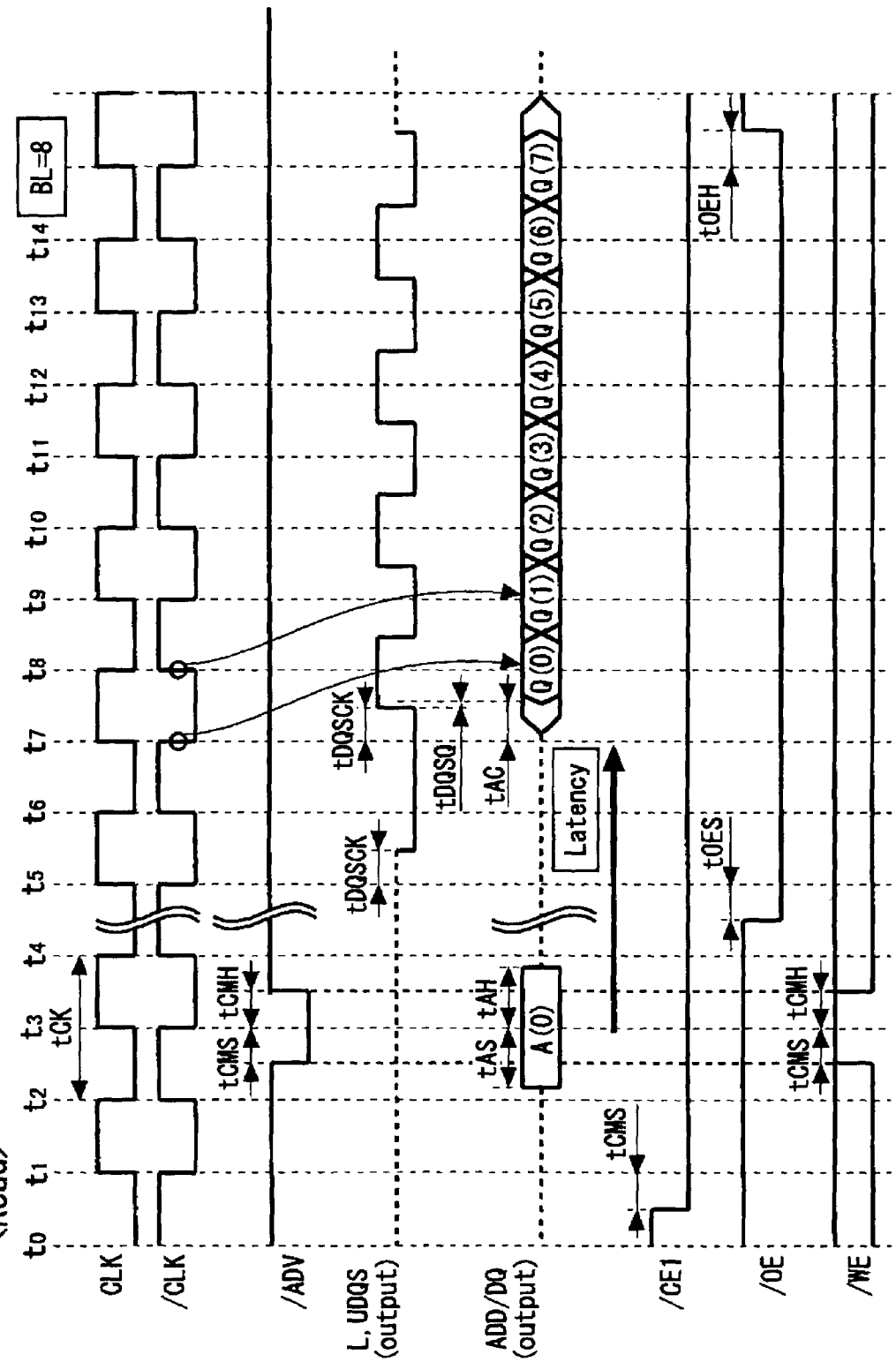
FIG. 3 is a timing diagram for describing the operation of the present embodiment.

FIG. 3 is a timing diagram for describing the operation of the present embodiment. FIG. 3 illustrates a read operation of a double-data rate (DDR) semiconductor storage device in which operation at both rising and falling edges of a clock is specified in a clock-synchronized DRAM adapted for address/data multiplexing that makes shared use of an address terminal and data terminal. It should be noted that the period between times t4 and t4 has been deleted.

In FIG. 3, CLK and /CLK are complementary clock signals; /ADV is an address-valid signal that is in the activated state at the low level and in this state indicates that an address signal is valid; L, UDQS is a control signal indicating that input/output data is data of a lower order byte and higher order byte; ADD/DQ is an address/data signal at the shared address/data terminal ADD/Data that shares and uses an address and data in multiplexing; /CE1 is a chip-enable signal that is in the activated state at the low level; and /OE is an output-enable signal that is in the activated state at the low level, thereby turning on a buffer circuit so that read-out data is output from the shared address/data terminal ADD/Data. Further, /WE is a write-enable signal that is in the activated state at the low level. When this signal is at the low level and chip enable is in the activated state, a write operation is performed. When this signal is at the high level, a read operation is performed. The address-valid signal ADV is a signal which, when at the low level, indicates that the address signal on the address bus is valid. An address signal that is valid is sampled in the register 104. Owing to latency, read-out data from the shared address/data terminal ADD/Data is output in a burst in accordance with a data strobe signal (LDQS, UDQS) of lower and higher order bits. In FIG. 3, the address-valid signal /ADV is activated (assumes the low level) at time t3, and read-out data Q0, Q1 is output at time t7, which is at the falling edge of the clock /CLK, and at time t8, which is at the rising edge of the clock /CLK, respectively. In FIG. 3, the address-valid signal /ADV may be activated and another read access inserted in the interval of t4 to t7 of the latency period.

Figure 4:
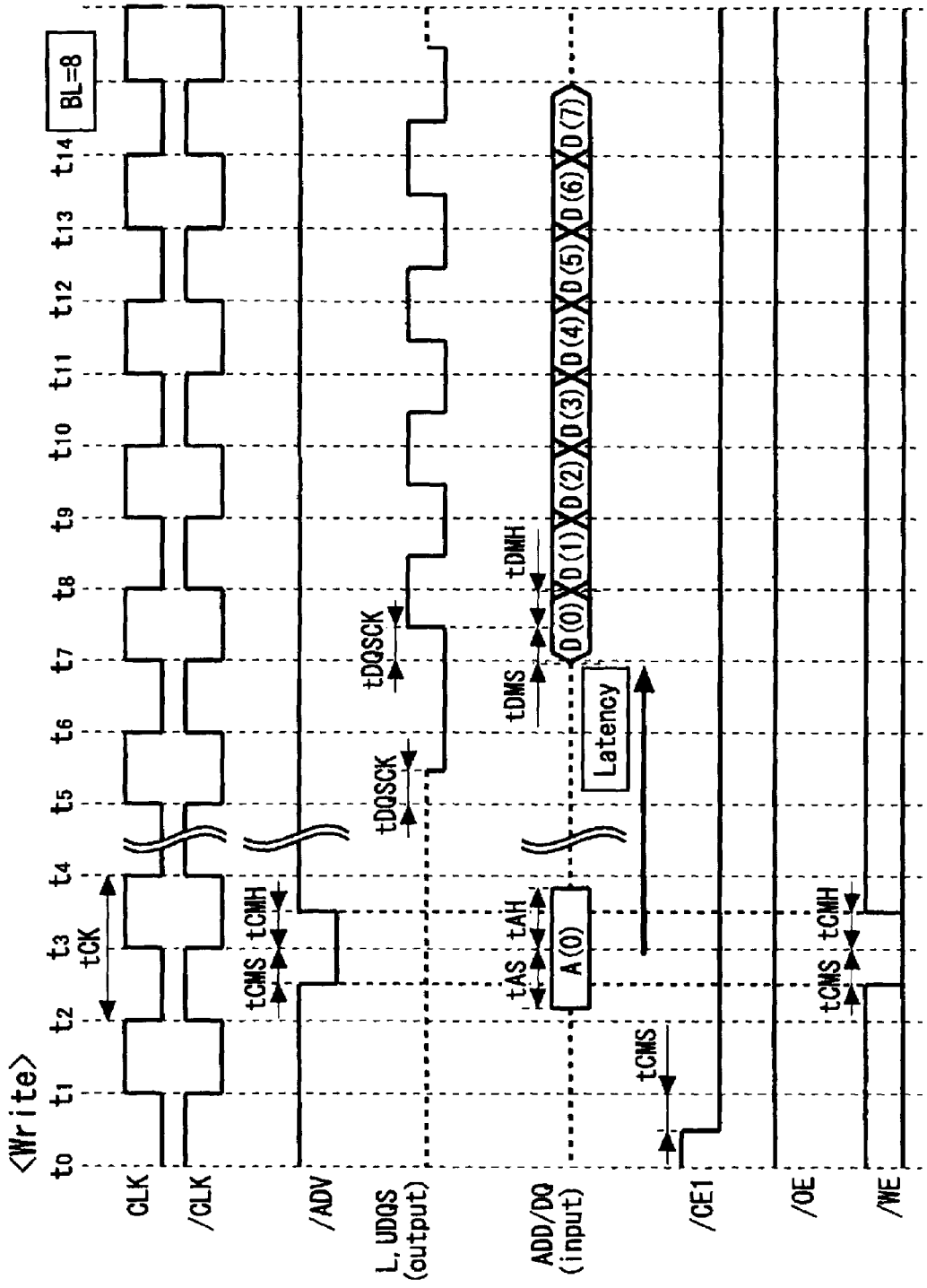
FIG. 4 is a timing diagram for describing the operation of the present embodiment.

FIG. 4 is a timing diagram for describing the operation of the present embodiment. FIG. 4 illustrates an example of a write operation in a clock-synchronizing semiconductor storage device the read operation of which is illustrated in FIG. 3. The address signal is sampled in the register 104 at the low level of the address-valid signal ADV. Write data is input from the shared address/data terminal ADD/Data with latency. In FIG. 4, the address-valid signal /ADV may be activated and another write access inserted in the interval of t4 to t7 of the latency period. In FIGS. 3 and 4, tCMS and tCMH are command setup time and hold time, respectively; tAS and tAH are address setup time and hold time, respectively; and tAC represents access time. However, as these signals and other timing information (tDQSCK, tDQSQ) do not have a direct bearing upon the present invention, they are not described here.

Figure 5:
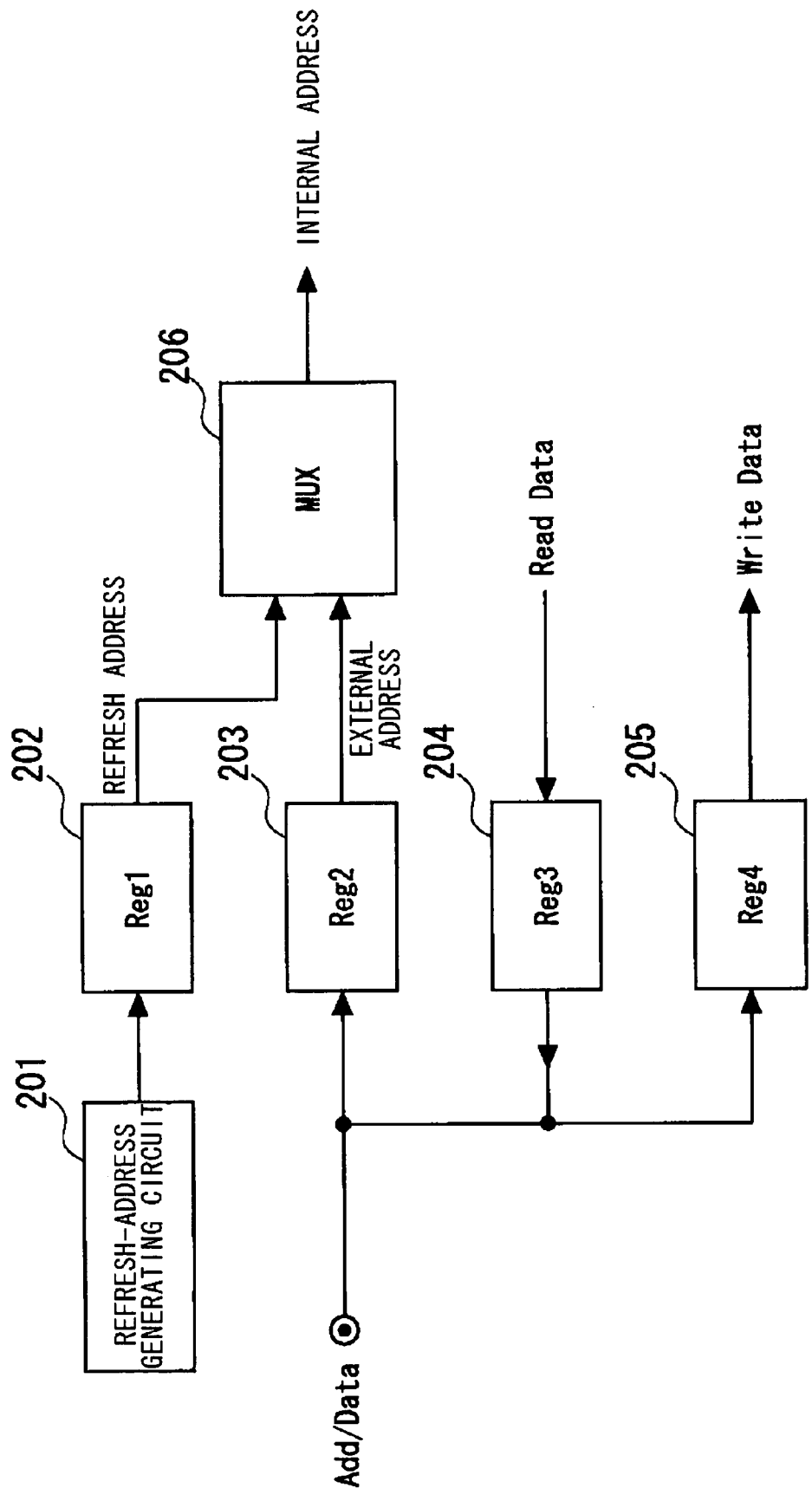
FIG. 5 is a diagram illustrating an example of the circuit structure of a DRAM adapted for address and data multiplexing according to this embodiment.

FIG. 5 is a diagram illustrating an example of structure in a case where the semiconductor storage device adapted for address and data multiplexing shown in FIG. 1 is applied to a DRAM that requires a refresh operation for data retention. As shown in FIG. 5, this semiconductor storage device includes a first register 202 for sampling an address, which has been generated by a refresh-address generating circuit 201, and outputting the address as a refresh address; a second register 203 for sampling the address signal from the shared address/data terminal ADD/Data; a third register 204 for sampling read-out data from the memory core; and a fourth register 205 for sampling write data from the shared address/data terminal ADD/Data.

Figure 6:
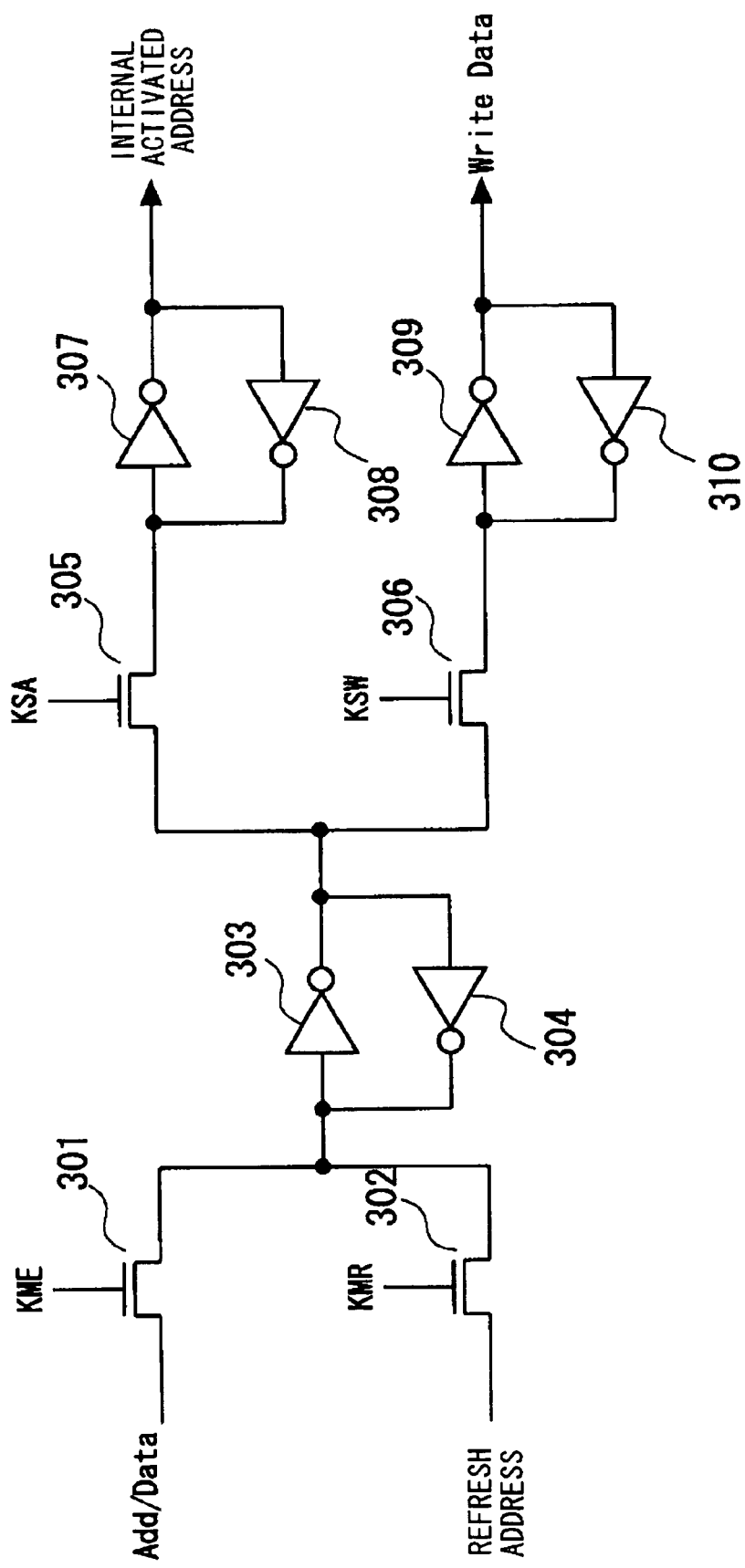
FIG. 6 is a diagram illustrating the circuit structure of another embodiment of the present invention.

FIG. 6 is a diagram illustrating the structure of another embodiment of the present invention. In this embodiment, the number of circuit elements is reduced by unifying the first register 202, second register 203 and fourth register 205 of FIG. 5.

As shown in FIG. 6, the semiconductor storage device according to the present embodiment includes a first switch 301 having one end connected to the shared address/data terminal ADD/Data and comprising a path transistor turned on and off by a control signal KME connected to the gate of the transistor, and a second switch 302 having one end connected to the output of the refresh-address generating circuit 201 (see FIG. 5) and comprising a path transistor turned on and off by a control signal KMR connected to the gate of the transistor. The other ends of the first and second switches 301 and 302 are tied together and connected to a first flip-flop (which comprises inverters 303 and 304, the input and output whereof are mutually connected). The device further includes third and fourth switches 305 and 306, respectively, having one end tied together and connected to the output of the first flip-flop. The third switch 305, which comprises a path transistor turned on and off by a control signal KSA connected to the gate of the transistor, has its other end connected to a second flip-flop (which comprises inverters 307 and 308, the input and output whereof are mutually connected) for outputting an internally activated address (the internal address of FIG. 1) that is supplied to a row decoder. The fourth switch 306, which comprises a path transistor turned on and off by a control signal KSW connected to the gate of the transistor, has its other end connected to a third flip-flop (which comprises inverters 309 and 310 the input and output whereof are mutually connected) for outputting Write Data.

Figure 7A:
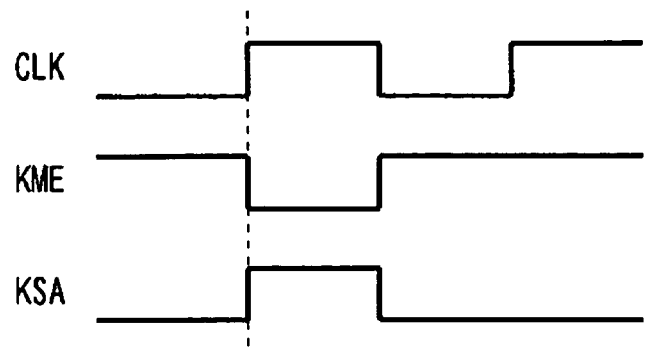
FIGS. 7A, 7B and 7C are timing diagrams for describing the operation of the present embodiment.

FIG. 7A is a diagram for describing the sampling of an external address signal in the implementation shown in FIG. 6. With KME at the high level, the first switch 301 turns on and an address signal enters from the shared address/data terminal ADD/Data. The control signal KSA is in the high level, the third switch 305 is turned on and the address signal is output as an internal address signal.

Figure 7B:
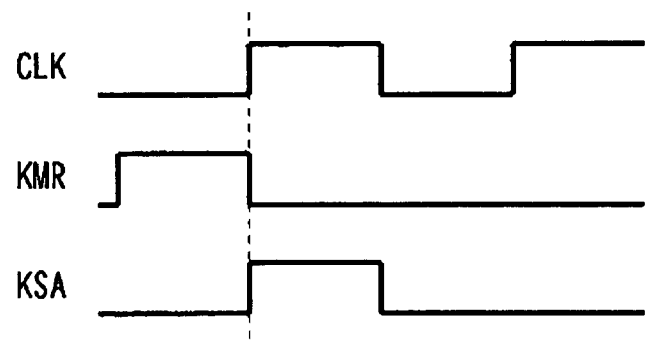

FIG. 7B is a diagram for describing the sampling of a refresh address in the implementation shown in FIG. 6. With KMR at the high level, the second switch 302 turns on and a refresh address signal enters from the refresh-address generating circuit. The control signal KSA attains the high level, the third switch 305 is turned on and the refresh address is output as an internal address signal.

Figure 7C:
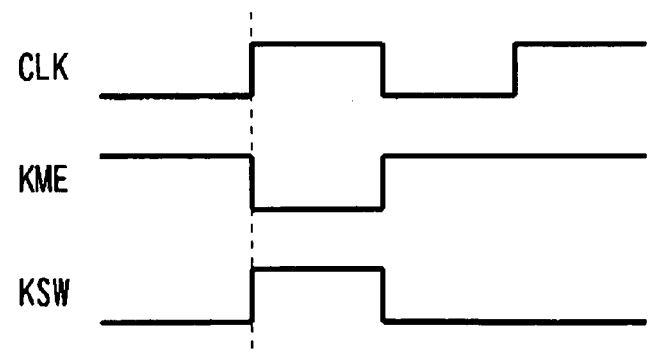
Figure 8:
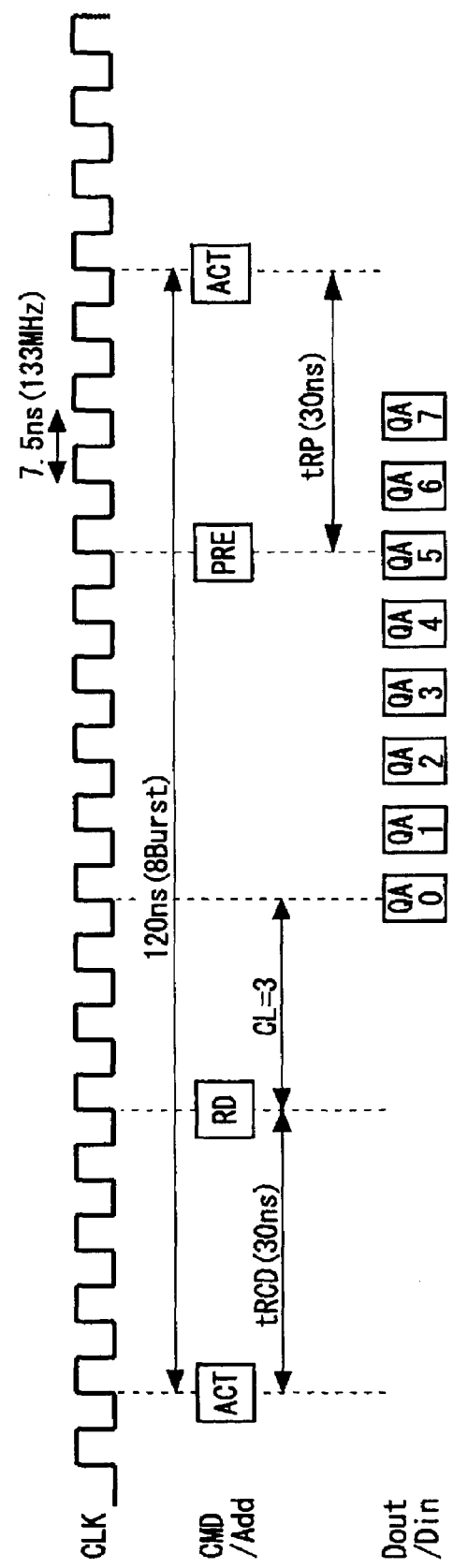
FIG. 8 is a diagram for describing the data transfer operation of a semiconductor storage device (SDRAM) according to the prior art.

FIG. 7C is a diagram for describing the sampling of write data in the implementation shown in FIG. 6. With KME at the high level, the first switch 301 turns on and a data signal enters from the shared address/data terminal ADD/Data. The control signal KSA attains the high level, the fourth switch 306 is turned on and the signal is output as Write Data.

Thus, in accordance with the implementation shown in FIG. 6, registers are shared and changed over by switches so that various registers are used, thereby reducing the scale of the circuitry further besides providing an address/data multiplexing function (A/D MUX).

The above embodiment has been described with regard to pipeline processing for effectively exploiting the latency period (RL) that extends from input of a command to output of data. Described below, however, is a semiconductor storage device having a data input/output terminal, in which an address signal and a data signal are separated. Another embodiment of a semiconductor storage device according to the present invention is a semiconductor storage device having a read/write-access pipeline function. In this semiconductor storage device, a write request and a write address are input in the same cycle as that in which a read-out data signal from a cell array corresponding to a read request accepted previously is output from the data input/output terminal. A write data signal corresponding to the write request is input from the data input/output terminal after read-out data corresponding to the read request is output from the data input/output terminal. By virtue of such an arrangement, read/write pipeline processing is implemented. Even if a read request is issued following a write request, pipeline processing is implemented in similar fashion. That is, in a cycle that follows a cycle in which a write request and a write address have been accepted, a write data signal corresponding to the write request is accepted, a read request and a read address are input in the same cycle as that in which the write data signal will be input from the data input/output terminal, and read-out data corresponding to this read request is output from the data terminal after the write signal has been input from the data input/output terminal. In another embodiment of the present invention, a two-state late-write scheme, in which the write data signal is written to the cell array upon receiving the write request twice, is adopted. Another embodiment of the present invention will be described with reference to the drawings.

Figures 9A, 9B:
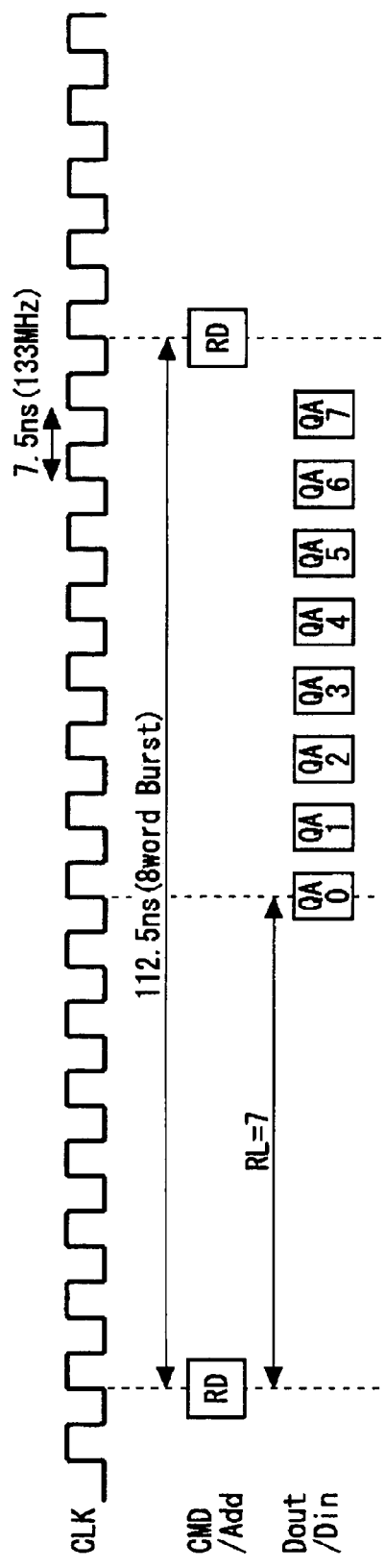
FIGS. 9A and 9B are diagrams for describing the data transfer operation of a semiconductor storage device (AD MUX MSRAM) according to the prior art.
Figure 10:
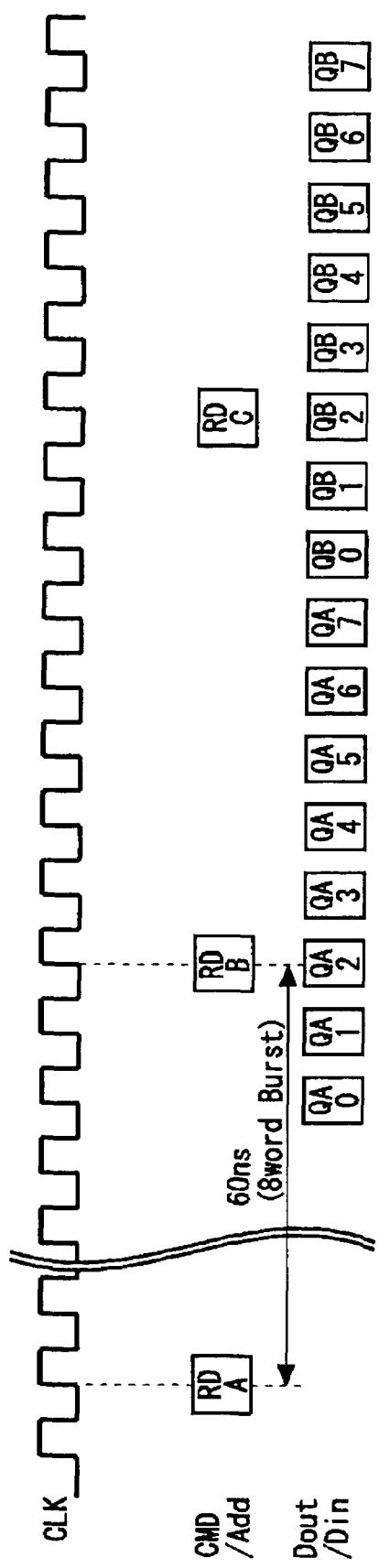
FIG. 10 is a diagram for describing the data transfer operation of a semiconductor storage device (pipeline-burst MSRAM) according to the prior art.

FIG. 11 is a diagram for describing an overview of the operating principle of another embodiment of the present invention. In FIG. 11, (A) is a diagram for comparison purposes illustrating the operation timing of a semiconductor storage device according to the invention in which pipeline processing is not executed. This corresponds to the timing diagrams of FIGS. 9A and 9B. In FIG. 11, (B) is a diagram useful in describing an example of a read operation in a semiconductor storage device according to this embodiment of the present invention, and (C) is a diagram useful in describing an example of a write operation in a semiconductor storage device according to this embodiment of the present invention.

As shown at (A) of FIG. 11, following a prescribed latency (e.g., RL=7) after input of an address A, read-out data A0 to A7 corresponding to address A is output from the data input/output terminal in a cycle the same as that in which the address was input. Although there is no particular limitation, burst length is assumed to be eight in the example shown in FIG. 11. Similarly, read-out data B0 to B7, C0 to C7 corresponding to addresses B, C, respectively, is output from the data input/output terminal following elapse of the latency period regarding addresses B, C, respectively.

Next, a read operation in this embodiment of the invention will be described with reference to (B) of FIG. 11. The "CELL ARRAY" section in (B) of FIG. 11 represents internal operation of the cell array. For example, "ARRAY A Read" of Cycle 1 represents the fact that read-out of address A is performed in the cell array. As illustrated at (B) of FIG. 11, read pipeline processing is executed in this embodiment. A read address (addA) is sampled in a cycle (Cycle 1) one earlier than that in which data is output from the data input/output terminal, read-out of data from the cell array is performed in this cycle (Cycle 1), and this data is sampled in a data register of a peripheral circuit (not shown) (e.g., in an output latch circuit 134 in FIG. 12, described later).

In the next cycle (Cycle 2) that follows the immediately preceding cycle (Cycle 1), the read-out data is output from the data input/output terminal [see "addA OUTPUT" in Cycle 2 at (B) of FIG. 11].

By virtue of this arrangement in accordance with this embodiment, latency (Latency') becomes two or three in a case where the address input (input of addB) in the next cycle (Cycle 2) is adopted as the timing reference. Thus, in accordance with this embodiment, latency is shortened markedly in comparison with that (read latency RL=7) illustrated in (A) of FIG. 11 [or FIG. 9A].

Next, a write operation in this embodiment of the invention will be described with reference to (C) of FIG. 11. In Cycle 1, read address A (addA) is input (the write-enable signal /WE is at the high level), a read operation is performed by the cell array and read-out data is stored in a data register (not shown) (e.g., in the output latch circuit 134 of FIG. 12).

In the next cycle (Cycle 2), write address B (addB) is input and the write-enable signal /WE is activated (reverts to the low level). In this cycle (Cycle 2), however, read-out data (addA outputs A0 to A7) corresponding to address A that was input one cycle earlier (Cycle 1) is output from a data register (not shown) to the data input/output terminal.

If write data should happen to be supplied to the data input/output terminal in Cycle 2, this data will collide with the read-out data. As a consequence, write data corresponding to write address B cannot be input from the data input/output terminal in Cycle 2.

Accordingly, in order to implement pipeline control in the present embodiment, it is so arranged that the read-out data signal corresponding to the read address applied in Cycle 1 is output from the data input/output terminal in Cycle 2, and the write data signal corresponding to write address B (addB) is input from the data input/output terminal in the next cycle (Cycle 3) and this signal is latched in a data register circuit (not shown) (an input latch circuit 131 in FIG. 12, described later).

When the write-enable signal /WE is activated in a subsequent cycle, which is Cycle 4 in the example of FIG. 11(C), write data that has been latched in a data register (not shown) (namely write data corresponding to address B) is written to the cell array. That is, the arrangement adopted is a two-stage late-write implementation.

By virtue of this arrangement in accordance with the present embodiment, latency is shortened. In addition, in a case where read access and write access are performed in mixed fashion, as when read access and write access are performed alternately, for example, in a semiconductor storage device having a data terminal for data input and output in common, idle cycles are eliminated, effective pipeline control is made possible and it is possible to support an improvement in the efficiency of the data bus, etc., as well as high-speed transfer.

On the other hand, in a case where the configuration according to the present invention is not adopted, write data cannot be input in a cycle that follows a cycle in which a read address is input. Write access takes place after read address ends (i.e., after read-out data has been output from the data input/output terminal). Access performance declines, the data bus, etc., cannot be utilized effectively and high-speed data transfer cannot be supported.

FIG. 12 is a diagram schematically illustrating an example of the overall structure of a semiconductor storage device according to the other embodiment of the present invention described with reference to (B) and (C) of FIG. 11.

As shown in FIG. 12, the semiconductor storage device according to this embodiment of the present invention includes an address latch circuit 120; changeover switches 126, 127; an address buffer 128; an R/W control-timing control circuit 129; a data latch circuit 130; switches 135, 136; a changeover switch 137; a data input buffer 139; a data output buffer 140; and a control signal generating circuit 141 for generating a control signal CWCNT. Though there is no particular limitation, a chip-select signal /CS, address-valid signal /ADV, write-enable signal /WE and output-enable signal /OE, etc., are input as control signals supplied from the outside.

The address latch circuit 120 has first and second write latch circuits 121 and 122 of two-stage construction for latching a write address, and a read latch circuit 124 for latching a read address. A switch 123 is provided between the output of the first write latch circuit 121 and the input of the second write latch circuit 122.

The R/W control-timing control circuit 129 generates a latch timing signal of the address latch circuit 120 (the write latch circuits 121, 122 and read latch circuit 124). It is of course permissible to use a signal synchronized to an internal clock signal (a clock signal generated internally of the semiconductor storage device and synchronized to an external clock signal) as the latch timing signal.

The control signal CWCNT is input to the changeover switches 126 and 127 as a changeover control signal. When the control signal CWCNT has been activated, terminals a and b of the changeover switches 126 and 127 conduct so that the output of the address buffer 128 is supplied to the input of the first write latch circuit 121. When the control signal CWCNT has been deactivated, terminals b and c of the changeover switches 126 and 127 conduct so that the output of the address buffer 128 is supplied to the input of the read latch circuit 124. The switch 123 is turned on and off by the control signal CWCNT. This switch is turned on when the control signal CWCNT is activated and is turned off when the control signal CWCNT is deactivated.

The chip-select signal /CS and write-enable signal /WE are input to the control signal generating circuit 141. In a case where the chip-select signal /CS has been activated (low level) and the write-enable signal /WE has been activated (low level), the control signal CWCNT is activated (high level). When the chip-select signal /CS transitions to the high level at the end of the cycle, the control signal CWCNT is reset to the deactivated state (low level). Though there is no particular limitation, the control signal generating circuit 141 may comprise an SR latch having a set terminal the input to which is the output of a NAND gate whose inputs are the chip-select signal /CS and write-enable signal /WE, and a reset terminal the input to which is the write-enable signal /WE. The operation of the embodiment illustrated in FIG. 12 will now be described.

When the chip-select signal /CS and the write-enable signal /WE are in the activated state (at the low level) (i.e., at input of a write request), the control signal CWCNT rises to the high level and the circuitry comprising the changeover switch 126, address latch circuit 120 and changeover switch 127 operate in such a manner that the output of the address buffer 128 is latched by the first write latch circuit 121. When the next write request is input, switch 123 is turned on. As a result, the second write latch circuit 122 latches and outputs the output of the first write latch circuit 121, and the output of the second write latch circuit 122 is supplied from the changeover switch 127 to the address decoder (not shown) of the memory core 100. In the cycle where the write-enable signal /WE has been activated, the control signal CWCNT is activated and the switch 135 is turned off. On the other hand, the switch 136, which is turned on and off by a signal that is the inverse of the control signal CWCNT (namely by the output of the inverter 138), is turned on. Further, the switch 133 is turned off, the terminals a and b are rendered conductive by the changeover switch 137 and the output of an input latch circuit 132 is connected to an input/output bus. At this time an address signal that is output from the address latch circuit 120 by two write-enable signals /WE is supplied from the changeover switch 127 to the memory core.

In a cycle where the write-enable signal /WE has been activated, e.g., Cycle 2 at (C) of FIG. 11, read-out data that has been latched in the output latch circuit 134 is output from the data input/output terminal Data via the switch 136 and the output-enabled data output buffer 140 (output-enable signal /OE is at the low level) if a read-access request was input in the previous cycle.

Further, in, e.g., Cycle 4 at (C) of FIG. 11, the input latch circuit 132 latches and outputs the output of the input latch circuit 131, and this output (write data) is supplied to the input/output bus line via the changeover switch 137. The write data is applied to the memory core 100. In Cycle 4, the read-out data that has been latched in the output latch circuit 134 is output from the data input/output terminal via the output buffer 140.

On the other hand, when the chip-select signal /CS is in the activated state and the write-enable signal /WE in the deactivated state (fixed at the high level) (i.e., at input a read request), the control signal CWCNT is set to the deactivated state (the low level) and the circuitry comprising the changeover switch 126, address latch circuit 120 and changeover switch 127 operate in such a manner that the output of the address buffer 128 is latched by the read latch circuit 124. This latched output is supplied to the address decoder (not shown) of the memory core 100 as an internal address. When the control signal CWCNT is in the deactivated state (at the low level), the switch 135 is turned on, the switch 136 is turned off, the switch 133 is turned off, terminals a and c are connected by the changeover switch 137 and the output from the input/output bus is supplied to the input of the output latch circuit 134. That is, write data from the data input/output terminal is latched in the input latch circuit 131 via the data input buffer 139 and the switch 135, which is in the ON state. Since the switch 133 is in the OFF state, the output of the input latch circuit 131 is not transmitted to the input latch circuit 132. Read-out data from the cell array is supplied to an latched in the output latch circuit 134 via the changeover switch 137. In FIG. 12, the latch circuits may be constituted by edge-trigger-type registers as a matter of course. Further, the switches 123, 133, 135 and 136 may be constituted by path transistors or CMOS-type transfer gates.

FIG. 13 is a timing diagram for describing the operation of the semiconductor storage device of the embodiment illustrated in FIG. 12. The timing waveform of the control signal CWCNT is shown in FIG. 13. In Cycle 1, the control signal CWCNT rises to the high level (for the duration of the write-address input interval) at the falling edges of the chip-select signal /CS and write-enable signal /WE and is reset to the low level at the rising edge of the chip-select signal /CS.

In Cycle 2, the control signal CWCNT is set to the low level (for the duration of the read-address input interval). The read address is input to the address terminal and write data corresponding to the address of Cycle 2 is input to the data terminal.

In Cycle 3, the control signal CWCNT rises to the high level at the falling edges of the chip-select signal /CS and write-enable signal /WE and read-out data corresponding to the read address that was input in Cycle 2 is output from the data terminal. The control signal CWCNT is reset to the low level at the rising edge of the chip-select signal /CS.

FIG. 14 is a diagram illustrating the structure of a register in a case where the cells of the cell array in the memory core 100 are constituted by DRAM cells that require refresh for data retention. As shown in FIG. 14, this embodiment differs from FIG. 5 in that the DRAM-cell refresh instruction enters from an external terminal (pin). Upon receiving the refresh instruction, a counter constituting the refresh-address generating circuit 201 outputs a refresh address. The refresh address is held by the register 202 and then supplied from the multiplexer 206 to the memory core 100 (FIG. 12) as an internal row address. Further, the address signal and data signal are not multiplexed, unlike the arrangement of FIG. 5. It should be noted that this embodiment may be applied to a pseudo-SRAM such as the above-mentioned MSRAM as a matter of course.

Further, according to this embodiment, as illustrated in FIG. 14, a pin for performing reset (flush) of a pipeline processing register (e.g., address latch circuit 120 and data latch circuit 130, etc., in FIG. 11) may be made to serve also as the refresh instruction input pin.

Further, though there is no particular limitation, it may be so arranged that whether or not pipeline control is carried out in this embodiment can be set from an external terminal. For example, it may be so arranged that by activating the address-valid signal /ADV, which indicates that the address signal on the address bus is valid, two times in succession, the device enters the pipeline control mode, and by activating the address-valid signal ADV two times in succession in the pipeline control mode, the pipeline control mode is exited. The external pin (Flush) in FIG. 14 is used in order to reset the pipeline registers, etc., when the pipeline control mode is exited.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device comprising:
    a cell array including a plurality of memory cells;
    a circuit for executing a read/write access pipeline;
    a circuit for exercising control in such a manner that a write request and a write address are accepted in a cycle in which a read-out data signal from the cell array corresponding to an earlier accepted read request is output from a data terminal, and write data corresponding to the write request is accepted from the data terminal after the read data is output from said data terminal;

a circuit for exercising control in such a manner that a write data signal corresponding to the write request is accepted from a data terminal in a cycle that follows a cycle in which the write request and a write address are accepted; and a circuit for exercising control in such a manner that a read request and a read address are accepted in a cycle the same as that in which the write-data signal is input, and read-out data corresponding to the read request is output from the data terminal after the write data is input from said data terminal.

2. The semiconductor storage device according to claim 1, wherein the data terminal comprises an input/output terminal connected in common with an input of an input buffer and an output of an output buffer.

3. The semiconductor storage device according to claim 1, wherein a latch circuit for latching the write data signal comprises a two-stage latch circuit; and an address latch circuit for latching the write address comprises a two-stage latch circuit.

4. The semiconductor storage device according to claim 1, wherein control for switching between entry to and exit from a pipeline is performed from an external terminal.

5. A semiconductor storage device comprising:
a cell array including a plurality of memory cells:
a circuit for executing a read/write access pipeline;
a circuit for exercising control in such a manner that a write request and a write address are accepted in a cycle in which a read-out data signal from the cell array corresponding to an earlier accepted read request is output from a data terminal, and write data corresponding to the write request is accepted from the data terminal after the read data is output from said data terminal; and a latch circuit for latching the write data, wherein when a write request that follows said write request is input, the write data is written to a cell array from said latch circuit, and wherein a read-out data signal corresponding to a read request input in a certain cycle is output from the data terminal in a next cycle that follows said certain cycle, wherein a write request and write address are input in said next cycle;

write data is input from the data terminal and held in said latch circuit in a cycle that follows said next cycle; and in a case where a write request is input in a cycle subsequent to the cycle that follows said next cycle, the write data is written from said latch circuit to said cell array.

6. A semiconductor storage device comprising:
a cell array including a plurality of memory cells;
a circuit for executing a read/write access pipeline;
a circuit for exercising control in such a manner that a write request and a write address are accepted in a cycle in which a read-out data signal from the cell array corresponding to an earlier accepted read request is output from a data terminal, and write data corresponding to the write request is accepted from the data terminal after the read data is output from said data terminal;

wherein the cell array comprises a dynamic-type memory that requires a refresh operation for retention of data; and wherein said semiconductor storage device further has an external terminal for resetting a pipeline register; said external terminal serving also as a terminal for inputting an externally applied refresh command.

7. The semiconductor storage device according to claim 6, constituting a pseudo-SRAM partially compatible with an interface of a static random-access memory (SRAM).

8. A semiconductor storage device comprising:
a data input/output terminal for inputting and outputting a data signal;

a cell array, which includes a plurality of memory cells, in which reading of a data signal from a memory cell, selected by an address signal, and writing of a data signal to a selected memory cell are performed;

an input latch circuit for latching write data from said data input/output terminal;

an output latch circuit for latching read-out data from said cell array; and an address latch circuit for latching a write address;

wherein in a cycle one earlier than a cycle in which read-out data is output from said data input/output terminal, a read address is sampled and read-out data from said memory cell is sampled in said output latch circuit, and when the read-out data that has been latched in said output latch circuit is output from said data input/output terminal in said cycle, the write address is latched in said address latch circuit if a write address and a write command have been input;

in a cycle that follows said cycle, write data corresponding to the write command is supplied to said data input/output terminal and is latched in said input latch circuit; and input of a succeeding command is received and write data that has been latched in said input latch circuit is written to said cell array.

9. The semiconductor storage device according to claim 8, wherein a read-out data signal from said output latch circuit is output to said data input/output terminal in a cycle the same as that in which a write address is input from an address terminal and latched in said address latch circuit; and write data that has been input from said data input/output terminal is latched in said input latch circuit in a cycle the same as that in which a read address is in put from said address terminal and read-out data from said cell array is latched in said address latch circuit.

10. The semiconductor storage device according to claim 8, further comprising:
a circuit for generating a signal in an activated state when a chip-select signal and a write-enable signal both are activated, and generating a control signal in a deactivated state in response to deactivation of the chip-select signal;

an input buffer having an input connected to said data input/output terminal, a tri-state output buffer having an output connected to said data input/output terminal;

a two-stage data input latch circuit in which data is written in a first-stage latch in response to activation of the write-enable signal, and write data of a second-stage latch is latched in response to activation of the next write-enable signal;

a data output latch circuit;

first and second switches; and a changeover switch;

wherein said first switch is connected between an output of said input buffer and an input of said data input latch circuit, said first switch being turned off and on when the control signal is activated and deactivated, respectively;

said second switch is connected between an input of said output buffer and an output of said data output latch circuit, said second switch being turned on and off when the control signal is activated and deactivated, respectively; and said changeover switch connects the output of said data input latch circuit and the input of said data output latch circuit to an input/output bus when the control signal is activated and deactivated, respectively.

11. The semiconductor storage device according to claim 10, further comprising:

an address latch circuit including a two-stage write latch circuit for latching a write address, and a read latch circuit for latching a read address; and second and third changeover switches;

wherein said second changeover switch is connected between an output of an address buffer and an input end of said address latch circuit and connects the output of said address buffer to said write latch circuit and to said read latch circuit when the control signal is activated and deactivated, respectively; and said third changeover switch delivers outputs of said write latch circuit and said read latch circuit to an address decoder as an internal address when the control signal is activated and deactivated, respectively.

12. The semiconductor device according to claim 8, wherein said data input/output terminal inputs an address signal as a shared address/data terminal.

13. The semiconductor storage device according to claim 12, wherein an operation for accessing said cell array corresponding to a received command, and output or input of a data signal, from said shared address/data terminal, corresponding to a command received prior to said received command, are performed in parallel.

14. The semiconductor storage device according to claim 12, wherein an operation for accessing said cell array corresponding to a received command, and output of a data signal, from said shared address data terminal, corresponding to a read command received prior to said received command, are performed in parallel.

15. The semiconductor storage device according to claim 12, further comprising:

a changeover circuit for changing over a signal which passes through said shared address/data terminal between the address signal and data signal;

a holding circuit for holding at least one received command; and a circuit for supplying a data signal input from said shared address/data terminal, to said cell array as a write data signal, and supplying a data signal read out of said cell array, to said shared address/data terminal;

wherein in a period of time from receipt of an access command to access said cell array to input or output of data, which corresponds to said access command, from said shared address/data terminal, at least one other access command is input and is held in said holding circuit, and commands held in said holding circuit are subjected to pipeline processing in order.

16. The semiconductor storage device according to claim 12, further comprising:

a changeover circuit for changing over a signal, which passes through said shared address/data terminal, between an address signal and data signal;

a holding circuit for holding at least one received command; and a circuit for supplying a data signal input from said shared address/data terminal, to said cell array as write data, and supplying read data from said cell array to said shared address/data terminal;

wherein in a latency period from receipt of one read command to access said cell array to output of a data signal, which corresponds to said one read command, from said shared address/data terminal, at least one other read command is received and while data read out of said cell array is output from the shared address/data terminal as a result of a read access of said cell array, read processing of another read command to said cell array is executed.

17. The semiconductor storage device according to claim 12, wherein said memory cell comprises a dynamic-type memory cell that requires refresh for data retention; and wherein said semiconductor storage device further comprises:

a first switch from one end of which an address signal from said shared address/data terminal is input and a second switch from one end of which a refresh address from said shared address/data terminal is input, other ends of said first and second switches being connected together at a common connection node and said first and second switches; being turned on and off by first and second control signals, respectively;

a first flip-flop having an input connected to said common connection node;

a third switch and a fourth switch having respective one ends tied together and connected to an output end of said first flip-flop, said third and fourth switches being turned on and off by third and fourth control signals, respectively; and second and third flip-flops having inputs connected to other ends of said third and fourth switches, respectively;

wherein said second and third flip-flops respectively output an internal address supplied to said cell array and write data supplied to said cell array.

* * * * *